United States Patent
Tsang et al.

(10) Patent No.: US 6,856,209 B2
(45) Date of Patent: Feb. 15, 2005

(54) EMI SUPPRESSION METHOD FOR POWERTRAIN CONTROL MODULES

(75) Inventors: David Y. Tsang, Canton, MI (US); Gregory Allen Jacobs, Dearborn, MI (US); Igor Belokour, Windsor (CA)

(73) Assignee: Visteon Global Technologies, Inc., Dearborn, MI (US)

(*) Notice: Subject to any disclaimer, the term of this patent is extended or adjusted under 35 U.S.C. 154(b) by 173 days.

(21) Appl. No.: 10/259,049

(22) Filed: Sep. 27, 2002

(65) Prior Publication Data

US 2004/0061566 A1 Apr. 1, 2004

(51) Int. Cl.⁷ ............................................. H04B 3/28
(52) U.S. Cl. ...................... 333/12; 333/22 R; 333/136; 333/247
(58) Field of Search ............................. 333/136, 247, 333/12, 22 R; 411/412; 174/132; 307/89

(56) References Cited

U.S. PATENT DOCUMENTS

| | | | |
|---|---|---|---|
| 4,473,755 A | | 9/1984 | Imai et al. |
| 4,875,457 A | | 10/1989 | Fitzner |
| 5,601,558 A | * | 2/1997 | Torrie et al. .................. 606/72 |
| 5,635,775 A | | 6/1997 | Colburn et al. |
| 5,955,141 A | * | 9/1999 | Soutar et al. .................. 427/98 |
| 6,016,084 A | * | 1/2000 | Sugimoto .................... 333/12 |
| 6,016,089 A | | 1/2000 | Goudie |
| 6,065,919 A | * | 5/2000 | Peck ........................... 411/412 |
| 6,166,457 A | * | 12/2000 | Iguchi et al. .................. 307/91 |
| 6,198,362 B1 | * | 3/2001 | Harada et al. ................ 333/12 |
| 6,657,291 B1 | * | 12/2003 | Magerlein et al. .......... 257/691 |
| 2001/0014963 A1 | | 8/2001 | Ando et al. |
| 2002/0071265 A1 | | 6/2002 | Centola et al. |

FOREIGN PATENT DOCUMENTS

| | | |
|---|---|---|
| JP | 2001023849 | 1/2001 |
| JP | 2001024334 | 1/2001 |

OTHER PUBLICATIONS

English Abstract of Japanese 2001024334.
English Abstract of Japanese 2001023849.

* cited by examiner

*Primary Examiner*—Robert Pascal
*Assistant Examiner*—Kimberly Glenn
(74) *Attorney, Agent, or Firm*—Brinks Hofer Gilson & Lione

(57) ABSTRACT

An electronic module configured to suppress electromagnetic radiation is disclosed. The electronic module has a plurality of electronic components disposed therein. The module includes a module housing, a circuit board, and a plurality of capacitors. The module housing is made of an electrically conductive material. The circuit board has a ground plane and is fixed to the module housing. The plurality of capacitors are coupled at first end to the ground plane and at a second end to the housing. Further, the capacitors are connected electrically in parallel and are uniformly spaced within the electronic module.

14 Claims, 4 Drawing Sheets

EMI SUPPRESSION METHOD FOR POWERTRAIN CONTROL MODULES

TECHNICAL FIELD

This invention relates generally to systems and methods for protecting electronic equipment from electromagnetic interference and to systems and methods for suppressing electromagnetic radiation.

BACKGROUND

Powertrain Control Modules (PCMs), used in vehicles to control engines and power transmission systems, must not interfere with surrounding electronic components (radiated emissions) and must also be capable of operating normally when subjected to certain levels of electromagnetic radiation (radiated immunity).

In some electronic control modules, a capacitor is placed in series between a copper ground plane of a printed circuit board (PCB) and a case ground, or metallic module housing. The metallic module housing is then mechanically and electrically joined to the vehicle's chassis via machine screws, brackets, or bolts, providing a substantially low impedance path for ground return currents to flow through. This design will provide some immunity to external electromagnetic interference (EMI), but may not necessarily quell radiated emissions. To achieve the goals of minimizing radiated emissions, while preserving radiated immunity, improvements are needed to provide suppression of radiated emissions.

Rakouth et al. describe a circuit for damping out radiated noise resulting from resonances in a controller module. (Rakouth, Comstock, and Cammin, *Characteristics of AC Grounding in an automotive ECU*, 2001 IEEE Intl Symposium on EMC). The Rakouth et al. circuit is composed of a 10 nF capacitor in series with a resistor, all of which is interposed between the case ground and controller B-line. In one embodiment, Centola, Bruno, et al, describe a method for electrically coupling PCBs' ground planes along their edges to the surrounding chassis ground in patent application 20020071265 as a means of reducing radiated emissions from a PCB. Patent Application 20010014963 describes a method for designing decoupling circuits centered around carefully chosen capacitors. Moreover, U.S. Pat. No. 6,016,089 discusses the use of common mode filtration capacitors that resiliently connect the ground plane of a PCB to a module case, or housing.

Virtually all PCMs equipped with Motorola Oak processors or similar type of processor have experienced electromagnetic compatibility (EMC) issues. Radiated emission (RE) levels from these modules typically exceeded acceptable levels.

Many experiments were attempted to reduce RE over the years. The most effective countermeasure involved modifying the case-grounding scheme of PCMs. In the past, the PCB was grounded, at a single point, to the case through a capacitor, with values typically ranging from 10 nF to 400 nF. The capacitor was put in place to reduce the risk of electrostatic discharge damage and radiated immunity issues.

Therefore, there is a need for an new and improved method and system for providing electromagnetic radiated immunity and reduced electromagnetic emissions. The new and improved method and system should minimize radiated emissions while preserving radiated immunity.

SUMMARY

In an aspect of the present invention, an electronic module configured to suppress electromagnetic radiation is provided. The electronic module has a plurality of electronic components disposed therein. The module includes a module housing, a circuit board, and a plurality of capacitors. The module housing is made of an electrically conductive material. The circuit board has a ground plane and is fixed to the module housing. The plurality of capacitors are coupled at first end to the ground plane and at a second end to the housing. Further, the capacitors are connected electrically in parallel and are uniformly spaced within the electronic module.

In another aspect of the present invention, a first conductive ring in electrical communication with one of the first and second ends of one of the plurality of capacitors is provided.

In yet another aspect of the present invention a fastening means is coupled to one of a first and second ends of one of the plurality of capacitors and to the module housing.

In yet another aspect of the present invention the fastening means is a self-tapping screw.

In yet another aspect of the present invention the fastening means includes a barbed surface for providing improved electrical and mechanical contact.

In yet another aspect of the present invention a washer is disposed between the fastener means and the circuit board for spreading compressive forces over the circuit board.

In still another aspect of the present invention a second conductor ring is provided in electrical communication with the first conductive ring.

In still another aspect of the present invention a conductive member in electrical communication with the first and second conductive rings is provided.

In still another aspect of the present invention the conductive member is a plated through hole via.

In still another aspect of the present invention the first and second conductive rings are immersion silver plated.

In still another aspect of the present invention the plurality of capacitors are surface mount devices.

In yet another aspect of the present invention a method for suppressing electromagnetic radiation in an electronic module, wherein the electronic module has a circuit board, the circuit board having a plurality of electronic components disposed thereon is provided. The method includes fixing the circuit board to a module housing wherein the housing is made of an electrically conductive material, electrically interconnecting the circuit board and the module housing using a plurality of conductive members, and coupling a plurality of capacitors at first end to a ground plane of the circuit board and at a second end to the plurality of conductive members wherein the capacitors are connected electrically in parallel and are uniformly spaced within the electronic module.

These and other aspects and advantages of the present invention will become apparent upon reading the following detailed description of the invention in combination with the accompanying drawings.

DETAILED DESCRIPTION

Figure 1A:
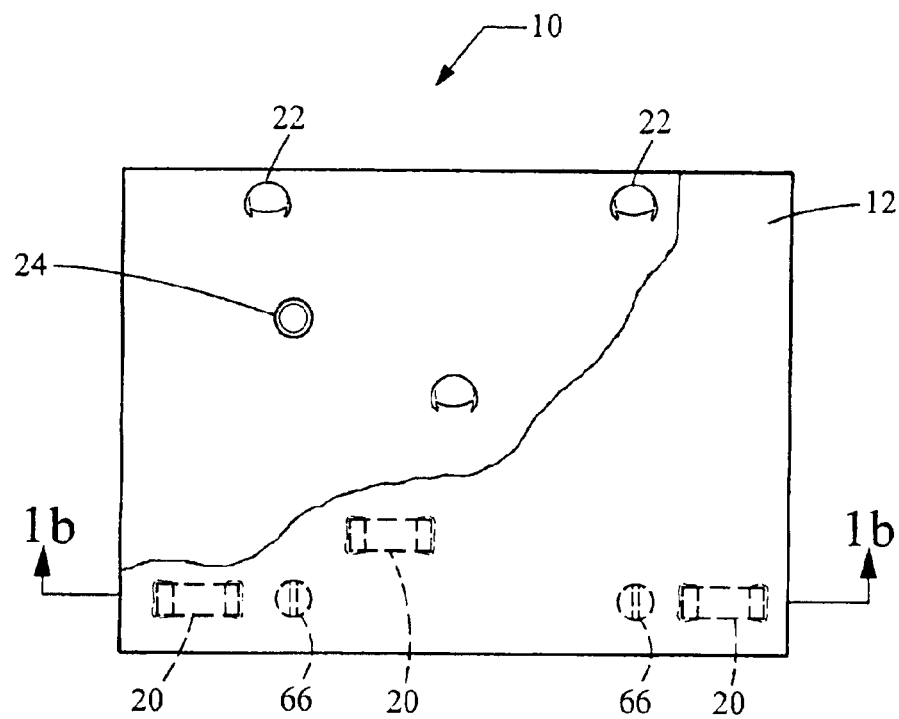
FIGS. 1a and 1b is a top and cross-sectional view of an electronic component having a system for suppressing electromagnetic radiation, in accordance with the present invention.
Figure 1B:
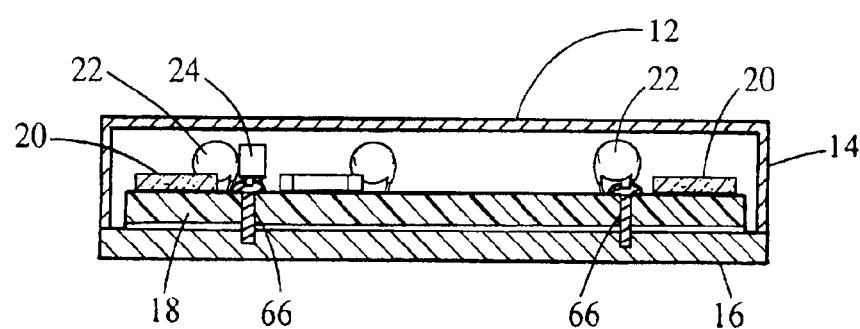

Referring now to FIGS. 1a and 1b, top and cross-sectional views of an electrical or electronic component 10, such as a powertrain control module (PCM) is illustrated, in accordance with the present invention. Electronic component or module 10 includes a housing 12 having a first cover portion 14 and a second cover portion 16. For example, first cover portion 14 may be a housing top cover and second cover portion 16 may be a housing bottom cover. Preferably, housing 12 is made of an electrically conductive material such as aluminum or the like. Further, module 10 includes an electronic circuit board 18, such as a printed circuit board (PCB). Generally, circuit board 18 is populated with electronic devices, such as resistors, capacitors, microcontrollers, inductors, etc. Circuit board 18 may be comprised of one layer or multiple layers.

Circuit board 18 is typically fastened to case 12 using a fastening means 19 such as a bolt or screw. For example, circuit board 18 may be fastened at each corner and in several locations within the circuit board.

In an embodiment of the present invention, a plurality of capacitors 20 are located proximate to the bolts or fasteners 19 that secure circuit board 18 to cover plate 16 of housing 12. Other capacitors 22 are located where the circuit board ground is connected to housing 12. Yet another capacitor is located proximate to and in communication with a connector pin between a power and a ground pin in module 10 connector. The capacitors are, as much as possible, uniformly distributed across the board. Better EMI suppression has been observed for uniformly distributed capacitors as compared to modules having case to ground capacitors in close vicinity to each other.

Figure 2A:
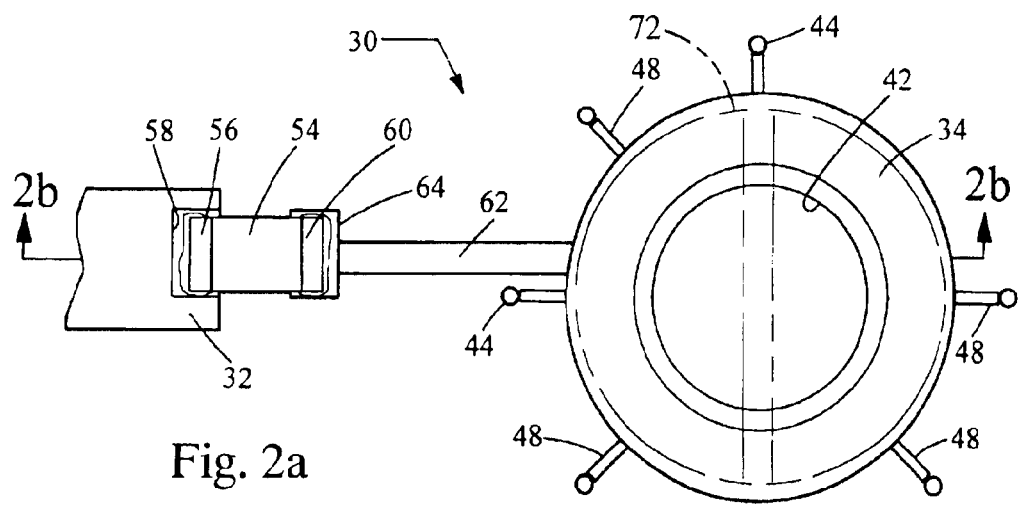
FIGS. 2a and 2b is a top and cross-sectional view of a fastening means for securing and electrically coupling ground plane of the circuit board to the housing, in accordance with the present invention.
Figure 2B:
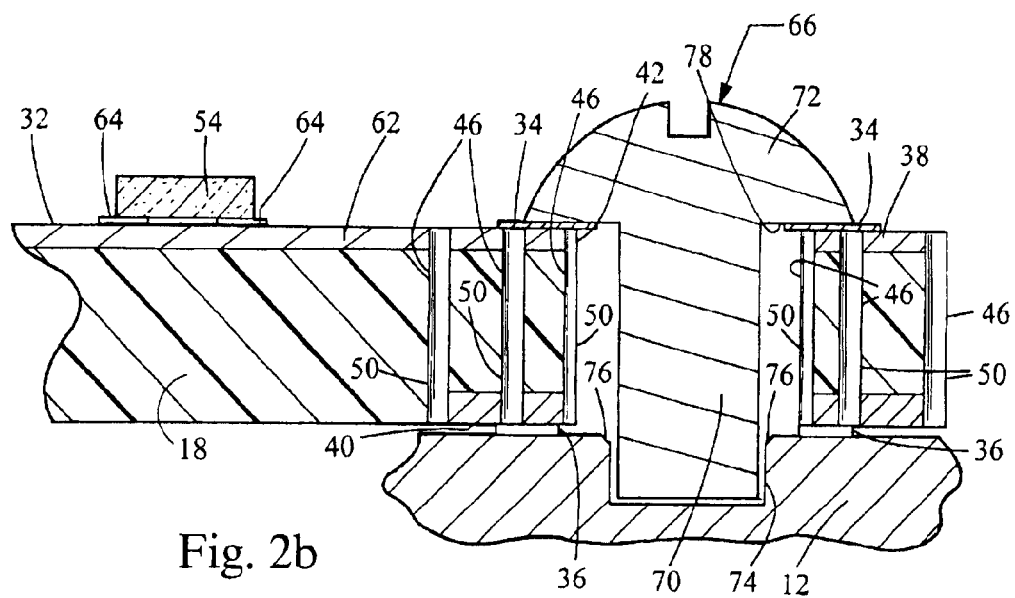

Referring now to FIGS. 2a and 2b, a top and cross-sectional views of a system 30 for securing and electrically coupling ground plane 32 of circuit board 18 to housing 12 are illustrated, in accordance with the present invention. System 30 includes two conductive rings 34 and 36 axially aligned and spaced apart by at least the thickness of circuit board 18. That is ring 34 is mounted to a first surface 38 of circuit board 18 and ring 36 is mounted to a second surface 40 of circuit board 18. Each ring 34, 36 is axially aligned with a through-hole or aperture 42 in circuit board 18.

In an embodiment of the present invention, a plurality of vias or plated through-holes 44 are positioned radially outward and circumferentially around rings 34, 36. Further, a first end 46 of each via 44 is connected by a conductive trace 48 to ring 34. Similarly, a second end 50 of each via 44 is connected by a conductive trace to ring 36. Thus, by this configuration, ring 34 is electrically connected through vias 44 to ring 36. Preferably, rings 34 and 36 are made of copper or similar material and immersion silver plated.

With continuing reference to FIGS. 2a and 2b, system 30 for providing electromagnetic interference protection and electromagnetic radiation suppression is further illustrated. In order to suppress or couple high frequency electromagnetic radiation, radiating from module 10 or providing immunity to module 10 from high frequency electromagnetic radiation, copper ground plane 32 of circuit board 18 is electrically coupled to case 12. More specifically, a capacitor 54 is electrically connected at one end 56 through a bonding pad 58 to grounding plane 32 and at another end 60 to a conductive trace 62 via a bonding pad 64. Conductive trace 62 is electrically connected to ring 34. Thus, any voltage built-up on ground plane 32 will be dissipated through housing 12 and vice versa.

In order to provide mechanical fastening of circuit board 18 to housing 12, a fastening means 66, such as a bolt or screw (i.e. a Torx-threaded machine bolt) is provided and extends through aperture 42. Fastening means 66 has a shaft portion 70 and a head portion 72. Shaft portion 70 is sized, such that the shaft portion extends through the thickness of circuit board 18 and additionally an appropriate distance into cover 12. Shaft portion 70 of fastening means 66 is preferably threaded, such that when screwed or turned into an unthreaded aperture 74 in housing 12 threads 76 disposed on shaft portion 70 cut into the sidewalls of aperture 74. Preferably, aperture 74 has a chamfered opening 76 which facilitates directing shaft portion 70 of fastening means 66 into aperture 74.

Head portion 72 of fastening means 66 further includes a radially extending flange 78 that seats on and contacts ring 34. Thus, fastening means 66 provides an additional electrical path between ground plane 32 and housing 12.

While surface mount capacitors 54 are illustrated, other capacitor devices are contemplated and may be used in place of surface mount capacitors 54 in accordance with the present invention. Surface mount capacitors offered by Vishay, AVX, or Murata may be used. Capacitors 54 are designed to withstand up to a continuous 200 V load and can operate in an underhood environment ranging from −40 C to 125 C. If there is an electrostatic discharge event at any one of the input pins to the module, the capacitors will prevent transient voltages exceeding 400 V from entering the module and damaging electronics. These capacitors are either a) directly connected to tooling holes of 6.3 mm diameter or b) connected to a solder pad tied to a nearby tooling hole through a very short PCB trace.

In yet another embodiment of the present invention, at least 6, or more, capacitors are provided and connected to the circuit board ground and housing as previously described. The capacitors equivalent parallel capacitance is approximately 10 nF or more. The capacitors as described above are electrically placed in series between the PCB ground plane and the housing. Relative to each other, the capacitors are in parallel electrically. Physically, the capacitors are uniformly distributed across the PCB so that the distance that electrical current would need to travel to reach a grounding point, and the resulting voltage gradient between the grounding point and source of noise current, is minimized. Voltage gradients that can arise across the surface of the PCB when there is only a single connection between the case and PCB ground are reduced. Reduction of these voltage gradients reduces the noise voltage emitted by module that can interfere with surrounding electronics.

Figure 3A:
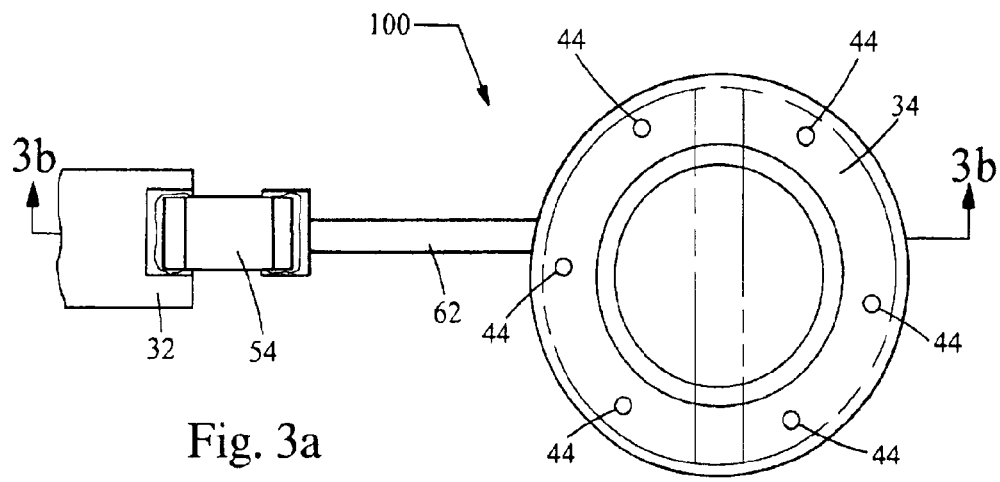
FIGS. 3a and 3b illustrate top and cross-sectional views through an alternate circuit board configuration for coupling a ground plane of circuit board to a housing, in accordance with the present invention.
Figure 3B:
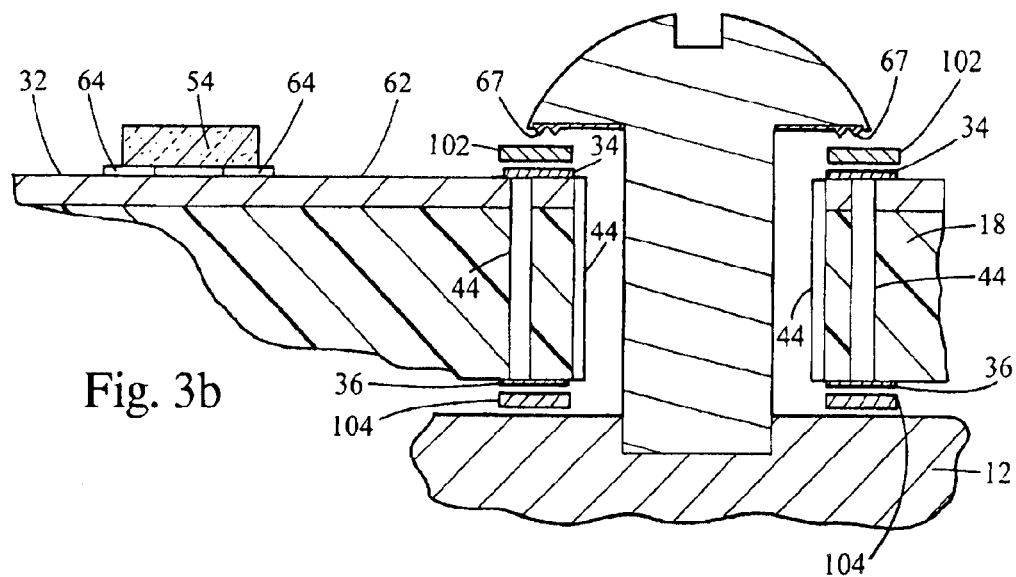

Referring now to FIGS. 3a and 3b, a top and cross-sectional views through an alternate system 100 for coupling a ground plane 32 of circuit board 18 to a housing 12 is illustrated. Alternate system 100 differs from previous embodiments in several ways for example, in the instant embodiment vias 44 are positioned directly between conductive rings 34 and 36. In order to prevent vias 44 from being damaged during the installation of fastening means 66, a pair of washers 102 and 104 are provided. Washer 102 is positioned adjacent ring 34 while washer 104 is positioned adjacent ring 36. Washers 102 and 104 are made of conductive materials such as metal (steel, alloy, etc.). Further, the present invention contemplates washers 102 and 104 made of conductive particle filled epoxy such as, epoxy offered by Emerson's (i.e. Cummings CE3104) or a conductive particle filled elastomer such as, elastomers offered by Chomerics (i.e. Cho-Seal 1298). Washers 102 and 104 help spread compression forces created by fastening means 66 over a larger area, thereby reducing stresses and subsequent damage to vias 44.

Preferably, fastening means 66 includes a barbed surface 67 on a flange portion of the screw head. Barbed surface 106 provides an enhanced contact, both electrical and mechanical between fastening means 66 and washer 102.

The present embodiment has many advantages and benefits for example, the relocation of vias 44 between conductive rings 34 and 36 frees up layout space on the circuit board 18. Further, system 100 provides a standardized design which may be used in circuit boards and electronic modules having different layout schemes. Moreover, the use of washers 102 and 104 reduce the stress created by fastening means 66 on the vias by spreading the stress out over a larger area while providing enhanced electrical contact. Further, the barbed surface of the head of fastening means 66 provide improved electrical contact.

Figure 4A:
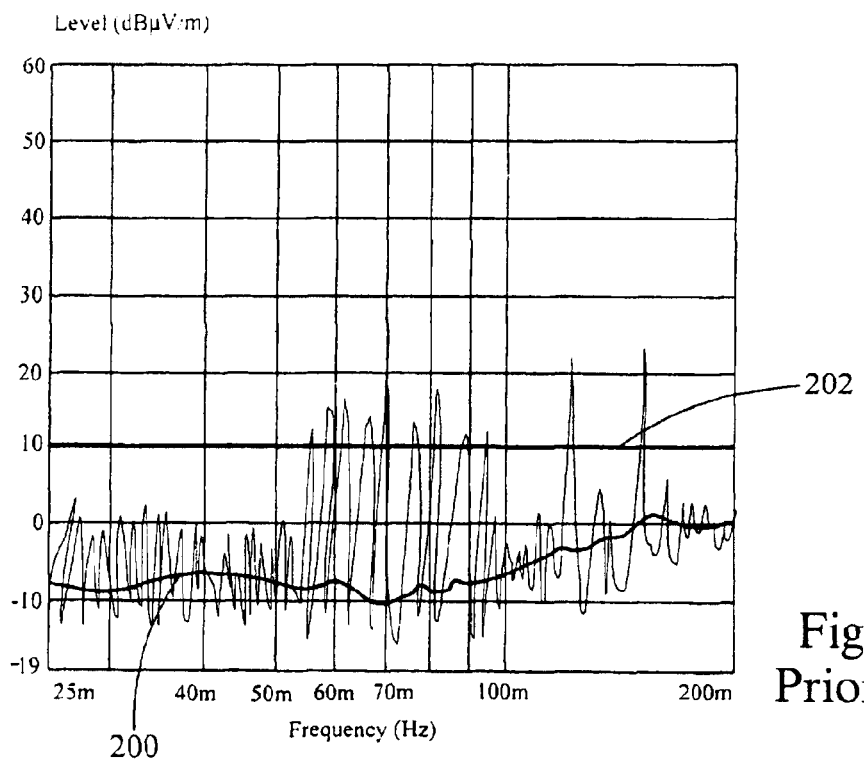
FIG. 4a illustrates an electromagnetic interference signal containing many different frequencies that vary amplitude levels.
Figure 4B:
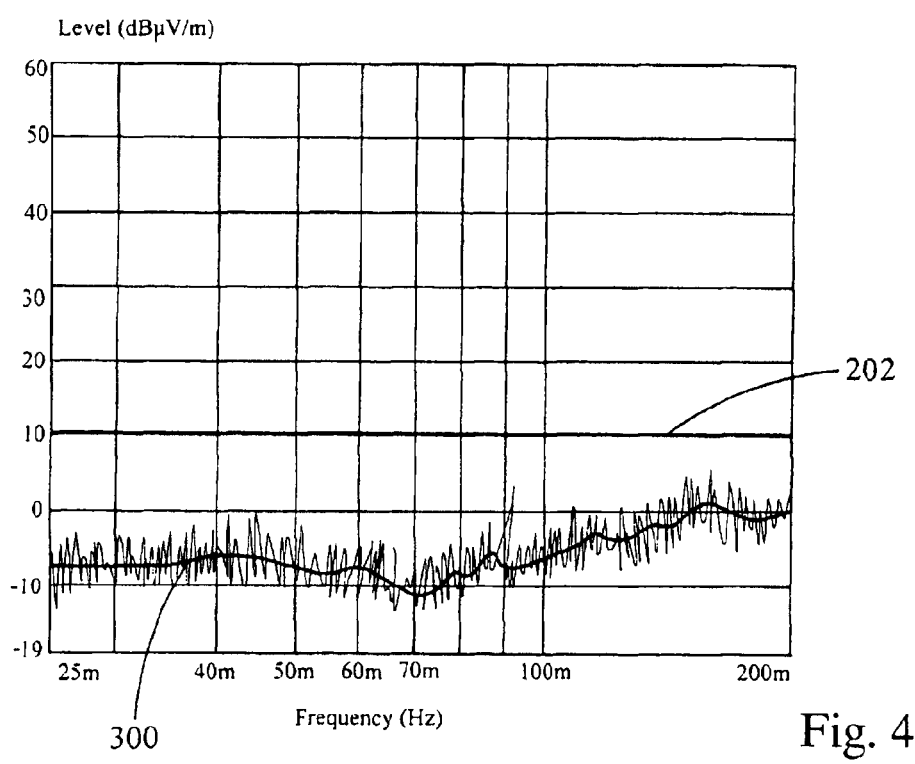
FIG. 4b illustrates a chart of an electromagnetic radiation signal over a frequency range, in accordance with the present invention.

Referring now to FIGS. 4a and 4b, a graph illustrating the effect of the system and method of the present invention on reducing radiating electromagnetic emissions. While the graphs illustrate improvements in radiated emission over a particular range, other frequency ranges have been tested and similar results have been observed. FIG. 4a shows an electromagnetic interference signal 200 containing many different frequencies having varying amplitude levels. A pass line is indicated by horizontal line 202. As long as the electromagnetic radiation has an amplitude level for a given frequency below pass line 202, the control module is acceptable with regard to electromagnetic radiated emissions. However, if at any frequency the amplitude of electromagnetic radiation 200 exceeds pass line 202, the control module may fail the test. The module that produced electromagnetic radiation 200 was a prior art module not equipped with the system and method of the present invention. As shown between the frequencies of 68 to 90 mHz approximately, amplitudes at those frequencies exceed pass line 202. Therefore, the control module (prior art) failed the radiated emissions test.

Reference is now made to FIG. 4b which illustrates a graph of electromagnetic radiation signal 300 over a frequency range, in accordance with the present invention. The control module tested in this case utilized the system and method of the present invention for reducing electromagnetic radiated emissions. The module that produced the results shown in FIG. 4b included the system and method of the present invention having a plurality of capacitors that couple the ground plane of the circuit board to the housing. Further, a capacitor is provided between power and ground as well as at locations where the PCB ground plane is connected to the housing. As compared to the graph shown in FIG. 4a the module utilizing the system and method of the present invention performs substantially better than the prior art module.

Advantages of the system and method of the present invention include, for example:

a) substantial reduction of radiated emissions across a wide range of frequencies pertinent to vehicle operation (especially FM radio frequencies);

b) radiated immunity to external EMI and electrostatic discharges;

c) compact footprint maximizes space for functionality; and d) minimal cost due to use of off-the-shelf capacitors and standard tooling holes.

As any person skilled in the art of systems and methods for protecting electronic equipment from electromagnetic interference and for suppressing electromagnetic radiation from electronic components will recognize from the previous detailed description and from the figures and claims, modifications and changes can be made to the preferred embodiments of the invention without departing from the scope of this invention defined in the following claims.

What is claimed is:

1. An electronic module configured to suppress electromagnetic radiation, wherein the electronic module has a plurality of electronic components disposed therein, the module comprising:

a module housing wherein the housing is made of an electrically conductive material;

a circuit board having a ground plane wherein the circuit board is fixed to the module housing;

a plurality of capacitors having first and second ends, wherein the first ends are coupled to the ground plane and wherein the capacitors are connected electrically in parallel and are uniformly spaced within the electronic module;

a first conductive ring fixed to a first side of the circuit board and in electrical communication with second ends of the plurality of capacitors;

a fastening means mechanically and electrically coupled to the first conductive ring and to the module housing;

a second conductor ring fixed to a second side of the circuit board; and a conductive member is disposed between the first and second conductive rings and electrically interconnects the first and second conductive rings, and wherein the fastening means, the first and second conductive rings and the conductive member create a ground path from the circuit board to the module housing.

2. The system of claim 1 wherein the fastening means is a self-tapping screw.

3. The system of claim 1 wherein the fastening means includes a barbed surface for providing improved electrical and mechanical contact.

4. The system of claim 1 further comprising a washer disposed between the fastener means and the circuit board for spreading compressive forces over the circuit board.

5. The system of claim 1 wherein the conductive member is a plated through hole via.

6. The system of claim 1 wherein the first and second conductive rings are immersion silver plated.

7. The system of claim 1 wherein the plurality of capacitors are surface mount devices.

8. A method for suppressing electromagnetic radiation in an electronic module, wherein the electronic module has a circuit board, the circuit board having a plurality of electronic components disposed thereon, the method comprising:

fixing the circuit board having a ground plane to a module housing wherein the housing is made of an electrically conductive material;

coupling a plurality of capacitors at a first end to the ground plane of the circuit board;

fixing a first conductive ring to a first side of the circuit board and in electrical communication with second ends of the plurality of capacitors;

fixing a second conductor ring to a second side of the circuit board;

mechanically and electrically coupling the circuit board to the module housing with a fastening means to the first conductive ring and to the module housing; and electrically interconnects the first and second conductive rings with a conductive member disposed between the first and second conductive rings and, thereby creating a ground path from the circuit board to the module housing.

9. The method of claim 8 wherein the fastening means is a self-tapping screw.

10. The method of claim 8 wherein the fastening means includes a barbed surface for providing improved electrical and mechanical contact.

11. The method of claim 8 further comprising spreading compressive forces over the circuit board using a first washer disposed between the fastener means and the circuit board.

12. The method of claim 8 further comprising spreading compressive forces over the circuit board using a second washer disposed between the circuit board and the module housing.

13. The method of claim 8 wherein the conductive member is a plated through hole via.

14. The method at claim 8 further comprising immersion plating the first and second conductive rings with silver.

* * * * *